United States Patent

Boleky et al.

[15] 3,646,666

[45] Mar. 7, 1972

[54] FABRICATION OF SEMICONDUCTOR DEVICES

[72] Inventors: Edward Joseph Boleky, Cranbury; Joseph Richard Burns, Trenton, both of N.J.

[73] Assignee: RCA Corporation

[22] Filed: Jan. 2, 1970

[21] Appl. No.: 206

[52] U.S. Cl. ................................29/577, 29/585, 317/40 A, 29/625

[51] Int. Cl. ........................................B01j 17/00, H01l 1/16

[58] Field of Search ...............29/577, 577 IC, 584, 585, 586; 317/13 B, 14 H, 40 A

[56] References Cited

UNITED STATES PATENTS

| | | | |
|---|---|---|---|
| 2,510,322 | 6/1950 | Shearer | 29/585 |
| 3,028,659 | 4/1962 | Chow et al. | 29/577 IC |
| 3,384,879 | 5/1968 | Stahl et al. | 29/577 IC |
| 3,562,586 | 2/1971 | Carter | 317/40 A X |

*Primary Examiner*—John F. Campbell
*Assistant Examiner*—W. Tupman
*Attorney*—Glenn H. Bruestle

[57] ABSTRACT

Information-storing devices, such as read-only-memories, comprise an array of semiconductor components on a substrate, each component being connected into the array by a fusible element. To disconnect selected ones of the components from the array, to store information, two sources of heat are applied to the fusible elements connected to the selected components to open-circuit the elements. One of the sources comprises the passage of current through the selected elements. The other comprises a general heating of the entire device.

5 Claims, 7 Drawing Figures

INVENTORS
Edward J. Boleky and
BY Joseph R. Burns.
M. Y. Epstein
ATTORNEY

INVENTORS
Edward J. Boleky and
BY Joseph R. Burns.

M.Y. Epstein

ATTORNEY

INVENTORS
Edward J. Boleky and
Joseph R. Burns.
BY
M.Y. Epstein
ATTORNEY

FABRICATION OF SEMICONDUCTOR DEVICES

BACKGROUND OF THE INVENTION

This invention relates to semiconductor devices, and particularly to semiconductor devices of the type comprising an array of semiconductor components on a substrate, said devices having utility, for example, in logic or information storage systems.

Certain types of semiconductive devices comprise a substrate having a plurality of semiconductor components, e.g., diodes, disposed on a surface thereof. The components are arrayed in an *X-y* matrix by means of two crossed, orthogonal sets of connector strips, each component being disposed adjacent to an intersection of a pair of strips, and being electrically connected between the pair.

To encode the matrix, i.e., provide information to be stored therein, selected ones of the components are disconnected from the matrix. To this end, according to one prior art arrangement, each component is electrically connected to one of its connector strips by means of a fusible element. Selected one of the components are disconnected from the matrix by causing a fusing current, i.e., a current sufficiently high to electrically heat the fusing element to the melting point thereof, to pass through the selected components and the fusing elements in series therewith.

A disadvantage of this arrangement arises from the fact that the fusing elements serve the alternative roles as either fuses to be selectively opened, or as electrical connectors for the components remaining in the matrix. Because, for the purpose of obtaining low-voltage operation of the semiconductor device, it is desired that the impedance of the component circuits be low, the resistance of the fusing elements is also preferably low. This gives rise, in the prior art method described, of the need for comparatively large fusing currents. A problem with the use of large fusing currents is that, in some instances, the passage of the fusing current through the semiconductor component in series with the fuse can result, prior to the burn-out of the fuse, in a change in characteristics of the semiconductor component which prevents fuse burn-out. For example, a large current can convert the PN-junction of the component into a large resistance which immediately reduces the current to an amplitude less than the required fusing current. Thus, the semiconductor component remains in the matrix. Also, the need for high fusing currents requires the use of large voltages across the series combination of fuse element and semiconductor component. The use of such large voltages, as known, can cause fusing currents to pass through other elements of the matrix which are electrically connected in parallel to the selected element. Thus, other elements of the matrix, intended to remain in the matrix, are disconnected therefrom.

SUMMARY OF THE INVENTION

A method of fabricating a semiconductor device comprising forming an array of semiconductor components, each of the components being electrically associated with the array by means of a fusible element, and open-circuiting selected ones of the fusible elements. The open-circuiting is achieved by applying two different sources of heat to selected ones of the elements, one of the sources, in a preferred embodiment, being the passage of an electrical current through the selected element.

DESCRIPTION OF THE PREFERRED EMBODIMENTS

The present invention is described in connection with semiconductor devices of the type having utility in the memory systems of computers, such devices being known as read-only-memories.

Figure 1:
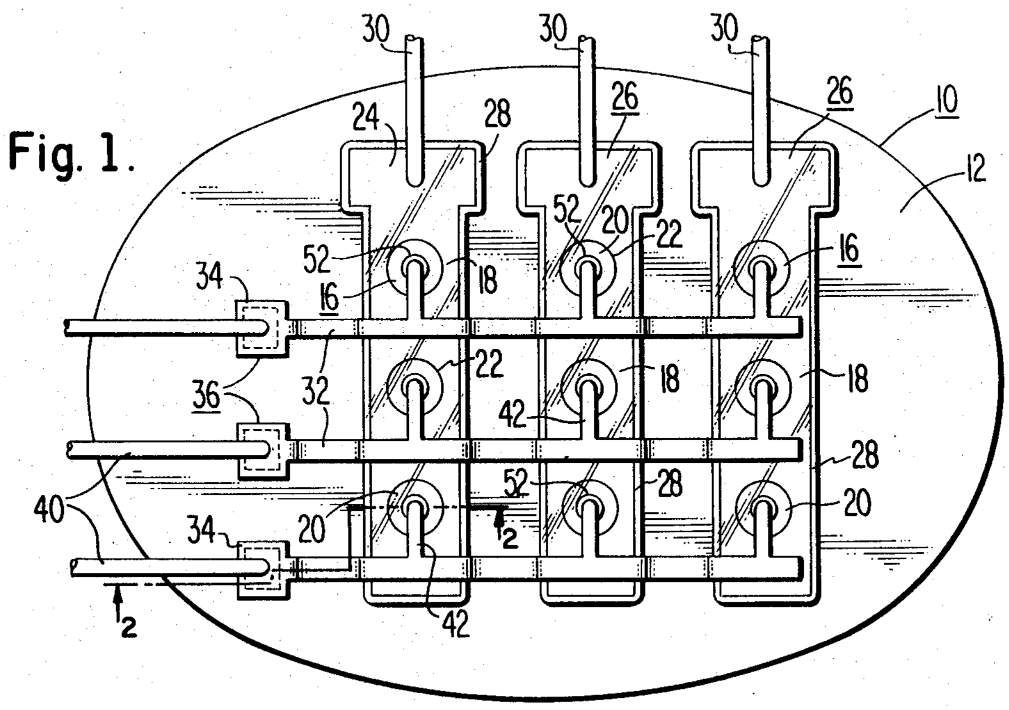
FIG. 1 is a plan view of a semiconductor device in accordance with the present invention.
Figure 2:
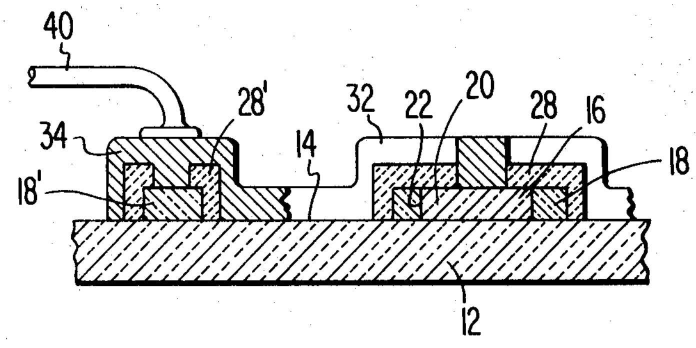
FIG. 2 is a section, on an enlarged scale, along line 2—2 of FIG. 1.

With reference to FIGS. 1 and 2, a read-only-memory device 10 is shown which comprises a flat substrate 12 of, in this embodiment, a dielectric material, e.g., sapphire. The substrate 12, depending upon the device being fabricated, can comprise any of several materials, e.g., metals, ceramics, semiconductors, or the like. On one surface 14 of the substrate 12 are a plurality of semiconductor components 16, diodes in the instant embodiment, arranged in an array of rows and columns.

Each diode 16 is an integral portion of an elongated strip 18 of a semiconductor material on the substrate surface 14. In this embodiment, the strips 18 comprise N-conductivity-type silicon. Circular regions 20 of the strips 18 are doped to P-conductivity type, thus providing PN-junctions 22 for the diodes 16.

The strips 18 comprise column connectors for the diodes 16, each strip 18 terminating in an enlarged portion 24 which forms part of a bonding pad 26. Covering each of the strips 18 and the enlarged portions 24 thereof is a layer 28 of an insulating material, e.g., silicon dioxide, silicon nitride, or the like. Fine wires 30 are connected to the bonding pads 26.

Crossing the strips 18, and being separated therefrom by the layer 28, are a plurality of metal strips 32, each of the strips 32 terminating in enlarged portions 34 which form part of bonding pads 36. Each pad 36 comprises a layer 18′ of silicon, a covering layer 28′ of the same material as the layer 28, and the metal portion 34. Fine wires 40 are connected to the bonding pads 36.

The metal strips 32 comprise row connectors for each of the diodes 16, and are connected to the diodes by means of fusible elements 42 connected to the strips 32 and connected to the P-regions 20 of the diodes 16 through openings through the insulating layer 28.

The read-only-memory device 10 shown in FIGS. 1 and 2 is normally mounted within an envelope including terminal means which are connected to each of the fine wires 30 and 40. Envelopes suitable for this purpose are well known; accordingly, an example thereof is not provided.

Further details of read-only-memory devices, and uses thereof, are described in U.S. Pat. No. 3,377,513 issued to R. A. Ashby, et al. on Apr. 9, 1968.

The fabrication of the device 10 is as follows.

Figure 3:
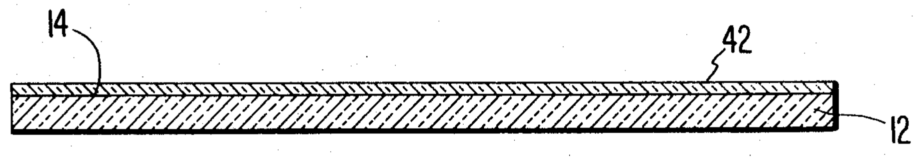
FIG. 3 is a sectional view of a workpiece substrate showing a step in the fabrication of the device shown in FIGS. 1 and 2.

Starting with a thin, flat substrate 12 of sapphire (FIG. 3), a thin layer 42 of N-doped silicon is epitaxially grown on a surface 14 of the substrate. Means for epitaxially growing silicon on a dielectric substrate are known.

Figure 4:
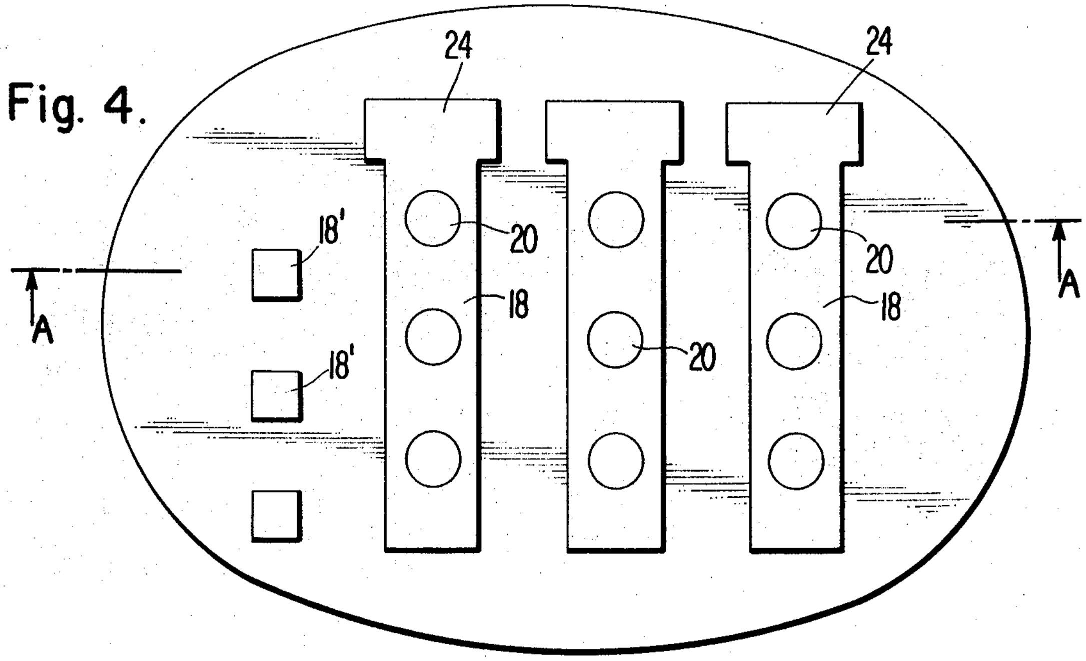
FIG. 4 is a plan view of the workpiece showing a subsequent step in the processing thereof.

Using standard masking and etching techniques, portions of the silicon layer 42 are then removed leaving a pattern (FIG. 4) of spaced longitudinally extending strips 18 and the elements 24 and 18′ of the bonding pads 26 and 36 (FIG. 1), respectively.

Spaced circular portions 20 of each strip 18 are then converted to P-conductivity type, using e.g., standard masking and doping techniques.

Figure 5:
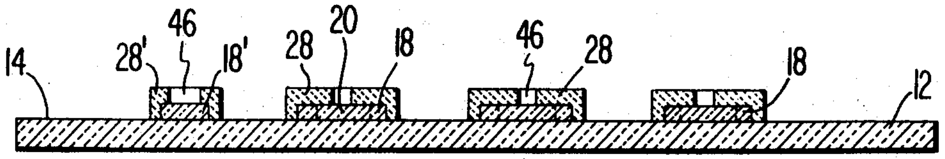
FIGS. 5 and 6 are central sections, looking in the direction of the arrows A of FIG. 4, of the workpiece showing still further steps in the processing thereof.

Thereafter, as illustrated in FIG. 5, the strips 18 and the bonding pad elements 18′ are covered with layers 28 and 28′, respectively, of an insulating material. In this embodiment, the layers 28 and 28′, comprise silicon dioxide provided, for example, by thermally converting a surface portion of the silicon to the oxide, in accordance with known processes. Openings 46 are then selectively etched through the layers 28 and 28′ to expose a surface portion of the P-type portions 20 of the strips 18, and surface portions of the bonding pad elements 18', respectively.

Figure 6:
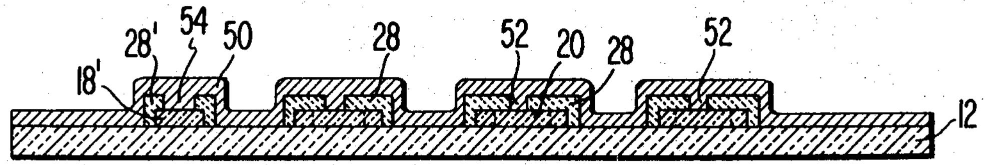

The entire surface of the workpiece is then coated (FIG. 6) with a layer of metal, e.g., aluminum, gold, nickel, or the like, deposited, e.g., by an evaporation or sputtering process. Portions 52 of the metal layer 50 extend through the openings 46 through the insulating layer 28 and cover the previously exposed surface portions of the P-type portions 20 of the strips 18. Also, portions 54 of the metal layer 50 extend through the openings 46 through the insulating layer 28' and cover the previously exposed surface portions of the bonding pad elements 18'.

Figure 7:
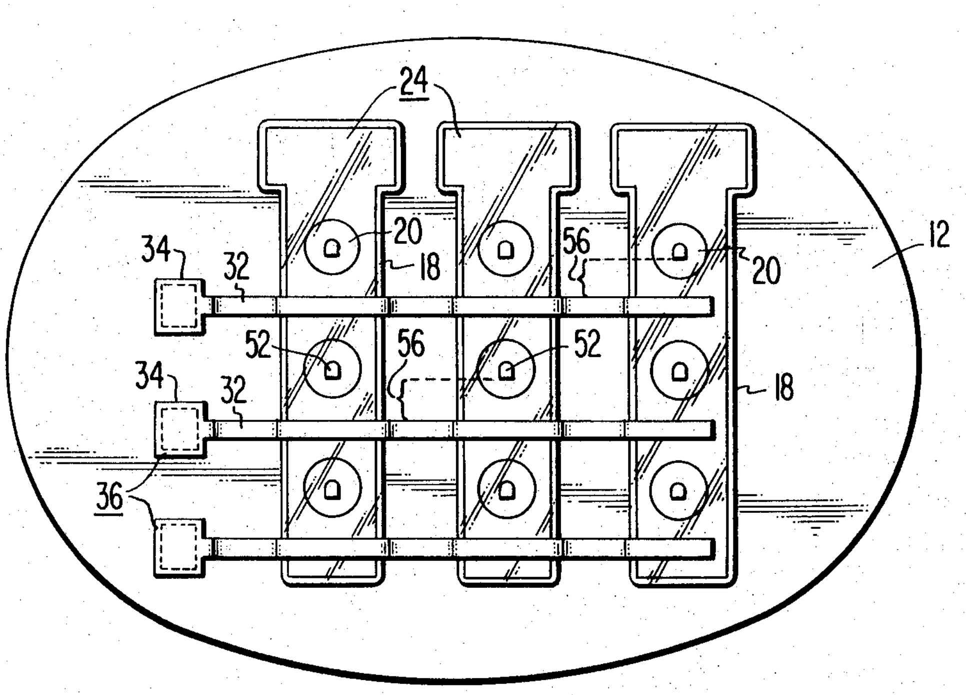
FIG. 7 is a plan view of the workpiece showing a still further step in the processing sequence.

Using known masking and etching techniques, portions of the metal layer 50 are then removed leaving a pattern (FIG. 7) of spaced laterally extending strips 32 each having an enlarged portion 34 forming part of the bonding pads 36, now completed. The metal portion 52, which extend through the layer 28 and into contact with the P-regions 20 of the strips 18, remain, but are separated from the strips 32 by a gap 56.

To bridge the gaps 56, the entire surface of the workpiece is then coated with an appropriate fuse metal, such as lead, as by an evaporation or sputtering process. Using known masking and etching techniques, portions of the lead layer are thereafter removed leaving the fusible elements 42 (FIG. 1) of lead extending between and overlapping the various strips 32 and the metal portions 52. The fusible elements 42 connect each diode into the matrix.

Connecting wires 30 and 40 are then bonded, as by known ultrasonic bonding techniques, to the bonding pads 26 and 36, respectively, and the workpiece is mounted within a suitable envelope.

After the completion of the above-described steps, either before or after the mounting of the workpiece within an envelope, the device is encoded, i.e., provided with stored information, by disconnecting selected ones of the diodes 16 from the matrix. This is accomplished by fusing or open-circuiting the fusible elements 42 connected to the selected ones of the diodes.

In accordance with the instant invention, fusing of the elements 42 is accomplished by applying two different sources of heat to the fusible elements, neither of which is sufficient, by itself, to fuse the elements. One of the heat sources is an electrical resistance heating provided by passing a current, via the appropriate pairs of intersecting strips 18 and 32, through the selected elements only. The other heating source, referred to hereinafter as the supplemental source, can comprise any of numerous heating sources, such as, for example, the use of a laser beam to heat individual ones of the fusible elements 42, 42, or preferably, and most simply, a means for heating the entire workpiece including all of the fusible elements 42, e.g., a heating pad on which the workpiece can be mounted.

THe use of electrical resistance heating provides a convenient means for open-circuiting only the selected ones of the elements 42. That is, addressing means for selectively applying voltage between selected pairs of a plurality of connectors are known and are readily available.

The use of a supplemental heating source reduces the amount of current otherwise required to cause open-circuiting of the elements 42. Thus, for example, in one use of the invention, in which a semiconductor device of the type herein described was mounted on a heating pad and heated thereby to a temperature of 150° C., the current required to fuse the elements 42, of lead, was 85 milliamperes. In the absence of a supplemental heating of the elements, the current required to fuse the elements 42 of an identical device at room temperature, e.g., 30° C., was 145 milliamperes.

While, as a practical matter, the workpiece is preferably supplementally heated to a temperature in excess of 100° C., for fusing elements of lead, in order to obtain a significant reduction in the fusing current, any supplemental heating of the fusing elements results in reduction of the current required.

As previously noted, a reduction in the required fusing current reduces the incidence of certain problems, such as the failure to open-circuit certain ones of the circuit elements owing to the high impedance of the semiconductor components caused by the high fusing current, or the unintended open-circuiting of elements connected in parallel with the selected elements owing to the high voltage required to produce the high fusing current.

Further, by reducing the amount of heat required of the resistance heating of the fusible elements 42, owing to the supplemental heating of the elements, the electrical resistance of these elements can be reduced. This is desirable with respect to providing devices operable at low voltages.

A further advantage of the instant invention is that it facilitates the encoding of devices in the field, i.e., in environs wherein specialized equipment, such as large power supplies to provide the large fusing currents, or lasers to vaporize the metal fuses, are not available. Using the instant invention, simple heating means, e.g., a socket having electrical resistance heating elements to provide the supplemental heating, and comparatively small and inexpensive power supplies can be used to encode the devices.

In a specific embodiment, the substrate 12 is of sapphire having a thickness of 10 mils. The silicon layers 18 and 18' have a thickness of 15,000 A., and are doped with phosphorous to a concentration of $1\times10^{17}$ atoms/cm$^3$. The P-doped portions 20 of the semiconductor diodes 16 are doped with boron to a concentration of $1\times10^{20}$ atoms/cm$^3$. The silicon dioxide layers 28 and 28' have a thickness of 5,000 A. The metal layer 34 comprises aluminum having a thickness of about 15,000 A., or higher. The bonding pads 26 and 36 measure 3 by 3 mils. The fusible elements 42 are of lead, and are 3,000 A. thick, 0.4 mils wide, and 13.3 mils long. At a temperature of 150°C., the fusing current for these elements 42 is 85 milliamperes.

While the invention has been described in connection with a semiconductor device comprising a matrix of diodes, with the fuses 42 connected in series with the diodes, the invention has utility with various other devices. For example, the fuses 42 can be connected in parallel with the diode elements, thus being effective, when not open-circuited or blown, of shorting the diodes out of the matrix. Fusing or open-circuiting the elements 42 thus, in this embodiment, serves to electrically "connect," rather than "disconnect," the diodes into the circuit. In still other embodiments, the semiconductor components and fuses are so connected that open-circuiting of the fusible elements 42 neither "connects" nor "disconnects" the semiconductor components from the matrix, but simply varies the electrical characteristics of the components in a manner to distinguish these components from components associated with unblown fuses. Examples of devices of this latter type will be apparent to workers skilled in the art.

We claim:

1. A method of fabricating a semiconductor device comprising:

forming an array of semiconductor components, each of said components being associated with said array by means of a fusible element, and applying heat to selected ones of said fusible elements from two different sources of heat to open-circuit said elements, one of said sources being the passage of an electrical current through said selected elements.

2. A method as in claim 1 wherein the amount of heat provided by neither of said heat sources is sufficient by itself to open-circuit said elements.

3. A method as in claim 2 wherein the heat from the other of said sources is applied to all of said elements.

4. A method of fabricating a semiconductor device comprising:

forming an array of semiconductor components each of which includes a fuse interconnected therewith, applying heat from a first source substantially equally and nonselectively to all of said fuses, and causing electrical resistance heating of selected ones of said fuses by passing an electrical current therethrough, neither the heat provided by said first source nor by said electrical resistance heating alone being sufficient to open-circuit said fuses.

5. A method of fabricating a semiconductor device comprising:

forming an array of semiconductor components, each of said components being associated with said array by means of a fuse, selecting semiconductor components to be disconnected from the array, applying heat from a first source substantially equally and nonselectively to all of said fuses, and passing an electrical current through the fuses associated with said selected components so as to generate heat within said fuses, said fuses being adapted to withstand the heat of either of said sources singly but to open-circuit in response to the additive heat from both of said sources.

* * * * *